(12) United States Patent
Ueno et al.

(10) Patent No.: US 6,656,260 B2
(45) Date of Patent: Dec. 2, 2003

(54) ZNS-SERIES SINTERED MATERIAL AND METHOD FOR PRODUCING THE SAME, TARGET USING THE ZNS-SERIES SINTERED MATERIAL, THIN FILM, AND OPTICAL RECORDING MEDIUM USING THE THIN FILM

(75) Inventors: Takashi Ueno, Tokyo (JP); Yukio Noguchi, Yohkaichi (JP)

(73) Assignee: Kyocera Corporation (JP)

(*) Notice: Subject to any disclaimer, the term of this patent is extended or adjusted under 35 U.S.C. 154(b) by 0 days.

(21) Appl. No.: 09/740,098

(22) Filed: Dec. 19, 2000

(65) Prior Publication Data

US 2001/0006035 A1 Jul. 5, 2001

(30) Foreign Application Priority Data

Dec. 28, 1999 (JP) ............................. 11-373803
Dec. 28, 1999 (JP) ............................. 11-373822

(51) Int. Cl.[7] .......................... C04B 14/00; C09C 1/04; C23C 14/00; B32B 19/00; G02B 17/00
(52) U.S. Cl. .............. 106/420; 204/192.1; 204/192.26; 428/689; 428/698; 359/586
(58) Field of Search .................... 204/192.1, 192.26; 428/689, 698; 359/586; 106/420

(56) References Cited

U.S. PATENT DOCUMENTS

| 5,372,874 | A | * | 12/1994 | Dickey et al. ............... 428/216 |
| 5,450,238 | A | * | 9/1995 | Bjornard et al. ............ 359/580 |
| 5,914,817 | A | * | 6/1999 | Browning et al. .......... 359/634 |
| 5,993,950 | A | * | 11/1999 | Novis et al. ................. 428/216 |
| 6,235,398 | B1 | | 5/2001 | Nakamura et al. .......... 428/432 |
| 6,252,703 | B1 | * | 6/2001 | Nakamura et al. .......... 359/360 |

FOREIGN PATENT DOCUMENTS

| JP | 5290408 A | 11/1993 | ............. G11B/7/24 |
| JP | 5-290408 | * 11/1993 | ................. 369/284 |
| JP | 07-138071 | 5/1995 | ......... C04B/35/547 |
| JP | 11-278936 | 10/1999 | ......... C04B/35/547 |

OTHER PUBLICATIONS

English Abstract of JP 5,290,408 above (1 page).

* cited by examiner

Primary Examiner—Mark L. Bell
Assistant Examiner—Patricia L. Hailey
(74) Attorney, Agent, or Firm—Synnestvedt & Lechner LLP

(57) ABSTRACT

The ZnS-series sintered material of the present invention includes ZnS as a main component and niobium oxide. The content of the niobium oxide in the sintered material is preferably in the range from more than 5 to 50% by weight, in terms of $Nb_2O_5$. The sintered material can be used as the sputtering target. Since this target has a low resistance, it is possible to deposit a thin film using this target by direct current (DC) sputtering. By employing the DC sputtering, the deposition rate of the thin film can be increased. The resultant thin film is used as a protecting layer for protecting a recording layer in an optical recording medium for recording a signal of a laser beam.

1 Claim, 3 Drawing Sheets

ZNS-SERIES SINTERED MATERIAL AND METHOD FOR PRODUCING THE SAME, TARGET USING THE ZNS-SERIES SINTERED MATERIAL, THIN FILM, AND OPTICAL RECORDING MEDIUM USING THE THIN FILM

BACKGROUND OF THE INVENTION

The present invention relates to a ZnS-series sintered material and a method for producing the same, a sputtering target formed from the sintered material, a thin film, and an optical recording medium having the thin film.

A ZnS-series material has been well known not only as a fluorescent substance but also as an electroluminescent substance. In the field of photoelectronics, the ZnS-series material is used as a thin film that has light transmission properties and a high refractive index. For example, in a phase change-type optical recording medium comprising a recording layer composed of an alloy of tellurium (Te) or antimony (Sb), the ZnS-series thin film is used as a protecting layer for protecting the recording layer. This medium has been used for rewritable optical disks, such as rewritable compact disks (CD-RW), random access memory digital video disks (DVD-RAM), DVD-rewritable (DVD-RW), DVD+rewritable (DVD+RW), and the like.

FIG. 4 shows the basic structure of an optical disk that serves as an optical recording medium. A first protecting layer 2 (21) is formed on a disk substrate 10. A recording layer 3 is formed on the first protecting layer 2 (21), and further, a second protecting layer 2 (22) is formed. A reflecting layer 4 is formed on the second protecting layer 2 (22). The reflecting layer 4 is composed of aluminum, gold, silver or an alloy containing these metals as a main component.

A laser beam is irradiated on the disk substrate 10 of the above-mentioned optical disk. The laser beam is transmitted through the protecting layers 2 (21, 22) to the recording layer 3 and is reflected by the reflecting layer 4. The reflected laser beam returns to the side of the irradiation source through the recording layer 3 and the protecting layers 2 (21, 22). In the phase change-type optical recording medium, in recording, the laser beam, which is modulated according to the signal strength, is irradiated to the optical recording medium. The heat energy of the laser beams causes a phase change in the recording layer. For example, the alloy thin film in the recording layer undergoes an alternate change between the crystal phase and the amorphous phase. This phase change is recorded as a signal. In reproduction, a laser beam is irradiated, causing a phase change in the recording layer 3. The change in reflection intensity of the laser beam in accordance with the phase change of the recording layer 3 is detected as a signal.

The protecting layers 2 transmit a laser beam and protect the recording layer 3 by contacting both surfaces of the recording layer 3. The protecting layers 2 are composed of, for example, a ZnS element or a ZnS—$SiO_2$ composite.

In optical disks that are rewritable on demand, during recording/erasing of the signal information by laser beam irradiation, the above-mentioned protecting layers 2 (21, 22) are heated in a temperature range of from 400 to 700° C. though for a very short time. Then, the protecting layers 2 (21, 22) undergo a considerable temperature change. Therefore, ZnS, which has an excellent heat resistance, has been used in the protecting layers 2 (21, 22). However, ZnS has a problem that a grain growth occurs due to repeated laser beam heating. A ZnS—$SiO_2$ composite is a material obtained by adding $SiO_2$ to ZnS. For example, a ZnS—$SiO_2$ composite having the composition of 80% by mole of ZnS and 20% by mole $SiO_2$ is known. The addition of $SiO_2$ suppresses grain growth caused by the repeated heating. Thus, the $SiO_2$-series thin film of the composition of 80% by mole ZnS and 20% by mole $SiO_2$ has been prepared to have a fine structure such that the particle diameter of the crystal is small.

Further, due to the high power laser beam irradiation during writing, the recording layer 3 undergoes a temperature change. That is, the recording layer 3 is heated and cooled. The two protecting layers 2 (21, 22) directly contact the recording layer 3. For preventing the protecting layers 2 (21,22) from reacting with the recording layer 3, they must have a low chemical reactivity to the alloy used for the recording layer 3 in a temperature range from room temperature up to a maximum of 700° C.

The protecting layers 2 (21, 22) can be deposited in a form of thin film by a radio frequency (RF) sputtering process. According to this process, the disk substrate 10 and a target are arranged to face each other in an RF sputtering apparatus. A ZnS—$SiO_2$ sintered material is used as the target material. Then, a high frequency plasma is generated in a high vacuum and rare argon (Ar). Argon ions, which are generated, cause the target to release material, which forms a thin film (the protecting layer 2) of the material on the disk substrate 10. In addition, after the deposition of the recording layer 3, the protecting layer 2, which is a thin film, is deposited on the recording layer 3 in the RF sputtering apparatus. Examples of ZnS—$SiO_2$ sintered materials are disclosed in Japanese Unexamined Patent Publication Nos. Hei 11-278936 and 7-138071.

To produce a sintered material, for example, a method in which a mixed powder of ZnS and silica is subjected to hot pressing in an inert gas atmosphere at a specific high sintering temperature and a method in which a shaped body comprising a mixed powder is subjected to atmospheric sintering have been used. Further, a hot isostatic pressing (HIP) method for further rendering the sintered material dense has also been used.

Conventionally, to deposit the protecting layer 2 in the above-mentioned optical recording medium using these ZnS—$SiO_2$ sintered materials, only the RF sputtering process can be employed. This is because a direct current (DC) sputtering process cannot be employed due to the high electric resistance of the ZnS—$SiO_2$ sintered material. However, in the RF sputtering process, it is difficult to apply a high electric power to the target. For this reason, the sputtering rate and the efficiency of deposition are lowered, and the productivity of the thin film for the optical recording medium cannot be improved.

In RF sputtering, high frequency electrical heating (high frequency heating) is generated in the disk substrate 10, which is made of a polymer such as polycarbonate. This may cause thermal damage to the disk substrate 10. This is also disadvantageous in the productivity of the optical recording medium. In the production of large capacity optical disks, it is necessary that the deposition rate be increased to improve the productivity of the thin film. For this reason, it has been preferred that a deposition process other than RF sputtering be applied to the production of optical disks.

To control the uniformity and thickness of the protecting layer 2, it is preferred to use a target having a size corresponding to the size of disk substrate 10. However, it is difficult to obtain a large, dense ZnS—$SiO_2$ sintered material. Therefore, both the sintering strength and the production efficiency are low when a large piece of ZnS—SiO$_2$ is used.

The target sintered material is required to have a small number of internal pores and a high relative density. Since it is difficult to obtain a large, dense piece of ZnS—SiO$_2$ sintered material, the porosity is relatively large. When sputtering is performed using a target sintered material having a large porosity, air contained in the sintered material is released, and to maintain the atmosphere in the sputtering apparatus at a high vacuum level during sputtering is difficult. When a composite material is deposited without maintaining the atmosphere in a high vacuum, the composition of the resulting thin film may become different from that of the sintered material. Further, when the atmosphere is not maintained in a high vacuum, the sputtering rate is lowered, which lowers productivity.

Although the thin film of a ZnS element has a relatively high refractive index due to addition of SiO$_2$ thereto, the refractive index of the ZnS—SiO$_2$-series thin film is lower than that of the ZnS element thin film. When the refractive index of the protecting layers 2 (21, 22) composed of a ZnS—SiO$_2$-series thin film is too low, as compared to the refractive index of each of the crystal phase and the amorphous phase of the recording layer 3 composed of the Ge—Te—Sb alloy layer, the optimal thickness of the protecting layers 2 (21, 22) for optimizing the reproduction signal strength ratio by a laser signal cannot be reduced significantly. When the thickness of the protecting layers 2 is relatively great, the heat caused by the laser beam irradiation in the protecting layers 2 (21, 22) during writing is difficult to remove due to low heat conductivity of the ZnS—SiO$_2$-series thin film. Thus, not only does the temperature of the protecting layers 2 rise, but the protecting layers 2 are easily peeled off.

A large capacity optical disk requires an optical recording medium having a high recording density. For increasing the density, attempts have been made to increase the revolution speed of the disk and shorten the wavelength of the laser beam. In the case where light having a wavelength of 400 nm is used, the rate change in the complex index of refraction of the recording layer 3 (composed of, for example, a Ge—Te—Sb alloy layer) following the phase change is small, and thus, the S/N ratio of the signal is small, as compared to the case where a light having a wavelength of 830 nm or 780 nm is used. To prevent the lower S/N ratio when the shorter wavelength is used, the protecting layers 2 (21, 22) are also required to have a higher refractive index. The ZnS element thin film has a refractive index n of about 2.35 for light having a wavelength of 400 nm, whereas the ZnS—SiO$_2$-series thin film has a lower refractive index n due to addition of SiO$_2$. However, preferably, the refractive index should be 2.50 or more.

As for the phase change-type optical recording medium, the substrate 10 of a conventional CD has a thickness of 1.2 mm, whereas the substrate 10 of a DVD has a thickness as small as 0.6 mm. The ZnS—SiO$_2$-series thin film not only has a low refractive index but also a low heat conductivity, so that internal stress is likely to occur in the thin film. Therefore, residual stress is generated in the substrate 10 and the optical recording medium. The stress may reduce the reliability of the optical recording medium.

As mentioned above, if it were possible to obtain a stable composite material having optical characteristics of a low electric resistance and a high refractive index, as compared to the conventional ZnS—SiO$_2$ composite material, such a material would be useful for the protecting layers 2 (21, 22) used in the optical recording medium. Such a material is expected to improve the performance of the optical recording medium, improve the efficiency of the production process, and reduce the production costs.

It is an object of the present invention to provide a sintered material having a low electric resistance and an excellent shaping property.

It is another object of the present invention to provide a sintered material composed of a ZnS-series material which can be used as a target for direct current sputtering.

It is another object of the present invention to provide a raw material powder for a sintered material.

It is another object of the present invention to provide a method for producing a sintered material.

It is another object of the present invention to provide a thin film having a refractive index higher than that of a thin film composed of a ZnS element and an optical recording medium having the thin film.

SUMMARY OF THE INVENTION

In one aspect of the invention, a ZnS-series sintered material includes ZnS as a main component and niobium oxide.

In another aspect of the invention, a sputtering target is made of a ZnS-series sintered material which includes ZnS as a main component and niobium oxide.

In yet another aspect of the invention, a raw material powder for forming a ZnS-series sintered material is provided. The raw material includes a ZnS powder having an average particle diameter of 0.5 to 20 μm and a niobium oxide powder having an average particle diameter of 5 μm or less.

In another aspect of the invention, a method for producing a ZnS-series sintered material includes preparing a mixture of a ZnS powder having an average particle diameter of 0.5 to 20 μm and a niobium oxide powder having an average particle diameter of 5 μm or less; and hot pressing the mixture at a temperature of 800 to 1100° C. to obtain a sintered material.

In yet another aspect of the invention, a method for producing a ZnS-series sintered material includes shaping a mixture of a ZnS powder having an average particle diameter of 0.5 to 20 μm and a niobium oxide powder having an average particle diameter of 5 μm or less into a predetermined shape; and sintering the resultant shaped body in an inert gas at a temperature of 700 to 1200° C., to obtain a sintered material.

In further aspect of the invention, a ZnS-series thin film includes ZnS as a main component and niobium oxide.

In another aspect of the invention, a method for producing a ZnS-series thin film includes preparing a ZnS-series sintered material comprising ZnS as a main component and niobium oxide; and subjecting the ZnS-series sintered material to direct current suputtering to form a ZnS-series thin film.

In yet another aspect of the invention, an optical recording medium includes a recording layer for recording a signal of a laser beam irradiation as a phase change; and a protecting layer for protecting the recording layer by coating. The protecting layer is made of ZnS-series thin film which includes ZnS as a main component and niobium oxide.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2(A) is a graph for a sample having a niobium oxide content of 20% by weight, and FIG. 2(B) is a graph for a sample having the niobium oxide content of 15% by weight. In each graph, the niobium oxide content was calculated in terms of $Nb_2O_5$.

FIG. 3(A) is a chart for a sample having a niobium oxide content of 10% by weight, and FIG. 3(B) is a chart for a sample having a niobium oxide content of 30% by weight. In each chart, the niobium oxide content was calculated in terms of $Nb_2O_5$.

DETAILED DESCRIPTION OF THE PREFERRED EMBODIMENTS

Figure 1:
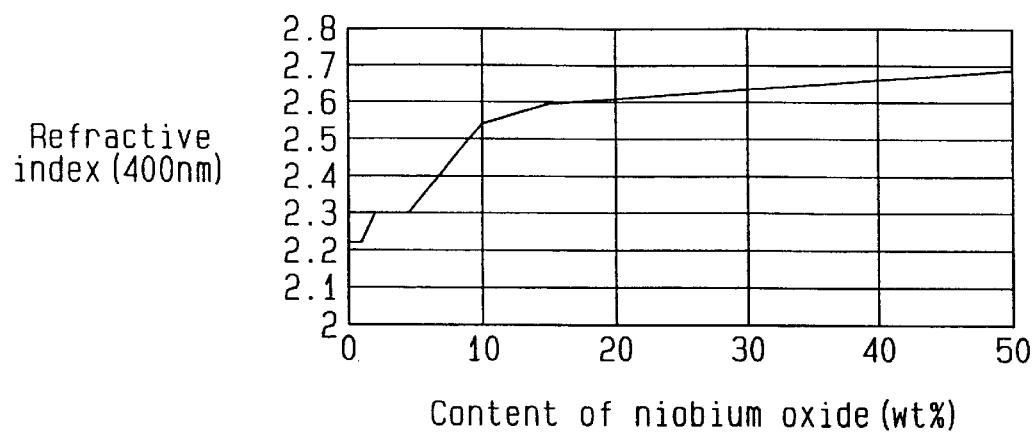
FIG. 1 is a graph showing the effect of the niobium oxide content on the refractive index of the ZnS-niobium oxide thin film according to one embodiment of the present invention.

The ZnS-series sintered material of the present invention comprises zinc sulfide as a main component and niobium oxide. In the present invention, the state of the niobium oxide in the sintered material is not necessarily clarified, and the niobium oxide includes a number of oxides in which the oxidation number of niobium is lower-order.

The niobium oxide content is preferably more than 5%, and 50% or less (% by weight; the same shall apply hereinafter), in terms of $Nb_2O_5$. ZnS is an electrical insulating material, whereas niobium oxide not only lowers the electric resistance of the ZnS-series sintered material, but also improves the sintering property of the sintered material. When the niobium oxide content is 5% or less, the electric resistance does not decrease significantly. When the niobium oxide content exceeds 5%, the electric resistance of the sintered material markedly decreases, so that the sheet resistance can decrease to 100 Ω/□ or less. Particularly, it is preferred that the sintered material contain 10% or more of niobium oxide, in terms of $Nb_2O_5$. On the other hand, in the sintered material comprising ZnS as a main component, it is preferred that the $Nb_2O_5$ content is 50% or less. The sintered material containing 10 to 50% of niobium oxide in terms of $Nb_2O_5$ has sheet resistance of about 10 Ω/□ or less.

The ZnS—$Nb_2O_5$ sintered material of the present invention has a low electric resistance. Thus, the material is used as a conductive ZnS-series sintered material. In an example of such application, the ZnS—$Nb_2O_5$-series sintered material of the present invention is used as a sputtering target for depositing a thin film. The target preferably comprises ZnS as a main component and more than 5 to 50% $Nb_2O_5$. For a sputtering target, it is preferred that the $Nb_2O_5$ content is in the range from 10 to 50%. The sintered material containing 10 to 50% $Nb_2O_5$ has a low resistance. For example, the sintered material containing a certain amount (10% or more) of $Nb_2O_5$ has sheet resistance of 10 Ω/□ at the highest. The use of the target of the above sintered material makes it possible to deposit a thin film not only by RF sputtering but also by DC sputtering. The DC sputtering facilitates supply of a large amount of a current to the target, thereby increasing the deposition rate of the thin film. This is effective for shortening the deposition step, thus improving productivity.

The addition of $Nb_2O_5$ to a ZnS-series sintered material improves the sintering property of the sintered material. Due to the improvement of the sintering property, a large plate-like sintered material which is free of defects can be formed. An optical recording medium having a large disk substrate can be formed from the sintered material of the present invention so that the sintered material can be effectively used as the target for DC sputtering.

It is preferred that the ZnS-series sintered material of the present invention is dense. The relative density of the sintered material is preferably 70% or more, especially 80% or more. Especially for using a sintered material as a sputtering target, the relative density of the sintered material should be 70% or more. When the relative density is less than 70%, the strength of the sintered material is low and the deposition rate of the thin film is too low. For increasing the deposition rate of the film in sputtering, it is preferred that the relative density be 80% or more. Further, for preventing the loss of vacuum during sputtering and a difference in composition between the sintered material and the thin film, it is preferred that the relative density be 90% or more.

The ZnS-series sintered material and the sputtering target comprising the sintered material of the present invention are made from a raw material mixture of a ZnS powder and a niobium oxide powder by sintering. The raw material comprises a ZnS powder having an average particle diameter of 0.5 to 20 μm and a niobium oxide powder having an average particle diameter of 5 μm or less.

The average particle diameter of the ZnS powder is related to the dense sintered material formation and the crack generation. For compactness, it is preferred that the ZnS particle is in a fine form such that the particle diameter is 20 μm or less. When the particle diameter of ZnS is more than 20 μm, it is impossible to form a dense ZnS-series sintered material under general sintering conditions. In addition, niobium oxide powder cannot be uniformly dispersed in such a coarse ZnS, causing a local distribution of the resistance value to occur in the sintered material. On the other hand, when the ZnS is very fine powder having an average particle diameter of less than 0.5 μm, internal stress is generated during sintering. The release of the stress often causes cracking.

It is preferred that the niobium oxide powder has an average particle diameter of 5.0 μm or less. When the average particle diameter of the niobium oxide is more than 5.0 μm, the niobium oxide is nonuniformly dispersed. This not only leads localized distribution of the resistance in the sintered material, but also causes a difference in composition between the sintered material and the thin film to occur during deposition by sputtering. Thus, the quality of the resultant thin film, particularly the optical characteristics, is reduced.

To produce the sintered material, a raw material powder obtained by mixing together ZnS powder and niobium oxide powder, each having the above-mentioned particle diameter distribution, is sintered while being maintained in a predetermined shape. The temperature for sintering is lower than the sublimation temperature of ZnS. Further, the sintering temperature is selected from a temperature range that facilitates a sintering reaction. From the viewpoint of preventing the sublimation, the upper limit of sintering temperature is preferably 1200° C. and the lower limit of the sintering temperature is preferably about 700° C.

In a method for producing a sintered material, or a sputtering target, the mixed raw material powder is subjected to hot pressing, to form a sintered material of desired shape.

In hot pressing, the mixed raw material powder is charged into a press die having a desired internal surface form. Subsequently, a plane pressure of 150 kg/cm$^2$ (14.7 Pa) or more is applied to the powder, and the powder is heated at the above-mentioned temperature for a required time to effect sintering. Preferably, the sintering temperature is 800 to 1100° C. When the sintering temperature is 800° C. or less, the sintering reaction may proceed slowly and the relative density of the resultant sintered material may become 80% or less. When the sintered material having a low relative density is used as a sputtering target, the deposition rate of the thin film in sputtering becomes low. Further, since such sintered material has a very low strength, cracks and defects may occur in the target when electric power is applied during sputtering.

In another method for producing the sintered material or a sputtering target, a raw material powder obtained by mixing together ZnS powder and niobium oxide powder is preliminarily shaped into a desired shape, and then the resultant shaped body is sintered in an inert gas at a temperature of 700 to 1200° C. under atmospheric pressure, to obtain a sintered material.

This method generally includes the steps of: preliminarily subjecting a mixed raw material powder to cold compression molding in a mold and heating the resultant molded body under atmospheric pressure, to effect sintering. Particularly, this method may include adding an organic binder to raw material powder including ZnS and niobium oxide; compression molding the powder using a mold for obtaining a sintered material in a desired shape; and subjecting the resultant molded body to atmospheric sintering in an inert gas at a temperature of 700 to 1200° C.

For making the sintered material dense, it is preferred that the sintered material that has undergone hot pressing or atmospheric sintering as mentioned above is further subjected to hot isostatic pressing (HIP). In this method, the pressure applied to the sintered material is 500 to 3000 Pa, and the sintering temperature is 800 to 1200° C. When the pressure is 500 Pa or less and the sintering temperature is 800° C. or less, satisfactory compactness, which is expected using HIP, cannot be obtained. In addition, even when the pressure is more than 3000 Pa, further compactness cannot be expected.

These sintering methods provide a dense sintered material. The sintered material is sure to have a relative density of 70% to 80% or more. Particularly, by employing HIP, a relative density of 90% or more can be obtained.

When the above-mentioned raw material powder is used for the protecting layer 2 for the above optical recording medium, it is preferred that each component of the raw material powder has high purity. Particularly, it is preferred that the ZnS powder and the niobium oxide has purity of 99.9% or more.

The ZnS powder and the niobium oxide powder often contain metal elements such as Fe, Ni, Cu, Mn, and Pd as impurities. When these elements are present in the protecting layer 2, its optical characteristics may be impaired, which impairs the reliability of the thin film. For this reason, it is preferred that the raw material powder to produce a sintered material has as pure as possible.

ZnS occurs as a hexagonal crystal system and a cubic crystal system. Both types of ZnS can be used. The hexagonal crystal system ZnS powder has a low reactivity with water, as compared to the cubic crystal system ZnS powder, therefore, it can be prepared into a slurry. Water and the ZnS powder are mixed together, to prepare the slurry. An organic binder is added to the slurry and stirred. Then, the resultant mixture is sprayed and dried, to obtain a dry powder. This powder is pressurized by molding or HIP into a pressurized powder. The pressurized powder is easily shaped into various large shapes. The pressurized powder can be subjected to atmospheric sintering in an atmosphere of inert gas.

The surface of the sintered material obtained by the above-mentioned methods is flat-finished, by grinding or abrasion, to effectively function as a sputtering target.

A thin film of the present invention includes ZnS and niobium oxide. The refractive index of the thin film is higher than that of the ZnS element. The thin film of the present invention is used as a thin film having a high refractive index. The niobium oxide is added to the ZnS-series thin film for increasing the refractive index of the thin film. When the niobium oxide content in the thin film is up to 10% (% by weight; the same shall apply hereinafter) in terms of $Nb_2O_5$, the refractive index of the thin film increases greatly with the increase in the niobium oxide content. However, when the niobium oxide content exceeds 10%, the refractive index increases relatively gradually. It is preferred that the content of the niobium oxide is in the range from 10 to 50%, in terms of $Nb_2O_5$. The thin film having a niobium oxide content of 10 to 50% has a high refractive index in the range from 2.5 to 2.7 for light having a wavelength of 400 nm.

Further, the ZnS-series thin film of the present invention has excellent heat resistance and heat dissipation characteristics. Particularly, this thin film can be used as a protecting layer in the phase change-type optical recording medium having a recording layer composed of an alloy containing Te or Sb.

As a protecting layer for an optical recording medium, the thin film preferably includes ZnS as a main component and 10 to 30% niobium oxide, in terms of $Nb_2O_5$. The thin film, which contains 10 to 30% niobium oxide, is extremely stable when heated. During erasing and recording in the optical recording medium, the protecting layer is heated up to a maximum of 700° C. and then rapidly cooled. When ZnS is heated and cooled in a wide temperature range from room temperature to 700° C., niobium oxide added to the ZnS has the effect of preventing the crystal growth of ZnS and the mixed material. Therefore, the mixed material including ZnS and niobium oxide remains stable in the amorphous state. This material can be used as a protecting layer for protecting the recording layer in the optical recording medium. The ZnS—$Nb_2O_5$ thin film obtained from a vapor phase is generally amorphous when the niobium oxide is composed of $Nb_2O_5$. Such an amorphous thin film has homogeneous chemical, optical and mechanical properties, as compared to the crystallized ZnS-series thin film. Particularly, the ZnS—$Nb_2O_5$ thin film has a small internal residual stress. Therefore, when this thin film is used in the above-mentioned optical recording medium, deformation of the disk substrate caused by the thin film can not be prevented.

In application of the thin film to a protecting layer, the thin film containing more than 30% of $Nb_2O_5$ is heated to about 700° C. due to the repeated irradiation of a laser beam, though for a very short time. Such repeated heating causes crystal growth and grain growth of ZnS or $Nb_2O_5$. In addition, the optical characteristics of the thin film are lowered and the stress generated within the thin film leads to deformation of the disk substrate.

The thickness of the thin film protecting layer is appropriately selected depending on the refractive index of the protecting layer so that the laser reflection strength ratio between the crystal phase and the amorphous phase of the recording layer becomes largest. The thin film of the present invention, which contains 10 to 30% niobium oxide, has a refractive index of 2.5 or more for light having a wavelength of 400 nm. In the present invention, the refractive index of the thin film is increased, so that the thickness of the thin film can be reduced. In view of the properties of the thin film, the thickness of the thin film protecting layer is preferably in the range from 10 to 500 nm, more preferably, from 50 to 300 nm. When the thickness is less than 10 nm, the thin film lacks thermal strength. When the thickness is more than 500 nm, lowering of the strength ratio of the laser (lowering of the S/N ratio) and peeling of the thin film may occur.

In the present invention, due to the small thickness of the protecting layer, it is possible to reduce the internal stress of the protecting layer depending on the thin film. Thus, not only is the optical recording medium more thermally stable, but less time is required for forming the protecting layer, which improves productivity.

The $ZnS$—$Nb_2O_5$ thin film of the present invention is deposited by a vapor deposition process, for example, a vacuum deposition process, a sputtering process, a plasma chemical vapor deposition (CVD) process, an optical chemical vapor deposition (CVD) process, an ion plating process, an electron-beam evaporation process or the like.

In the present invention, the electric resistance of the niobium oxide and the $ZnS$—$Nb_2O_5$ sintered material for a thin film lowered.

In the thin film of the present invention, to lower the electric resistance, the content of the niobium oxide in the thin film is preferably more than 5%, and 50% or less, in terms of $Nb_2O_5$. This range of content allows the sheet resistance to be lowered. Especially when the niobium oxide content is in the range of from 10 to 30%, in terms of $Nb_2O_5$, further lower sheet resistance can be obtained.

Using the $ZnS$—$Nb_2O_5$ sintered material of the present invention, a thin film can be efficiently deposited by deposition process (for example, DC sputtering) in which a current flows through the target sintered material. The DC sputtering process was not employed in the deposition of the protecting layer composed of the conventional $ZnS$—$SiO_2$-series thin film but is employed in the deposition of the $ZnS$—$Nb_2O_5$-series thin film of the present invention. The thin film deposition rate of the DC sputtering process is higher than that of the conventional RF sputtering process.

Figure 4:
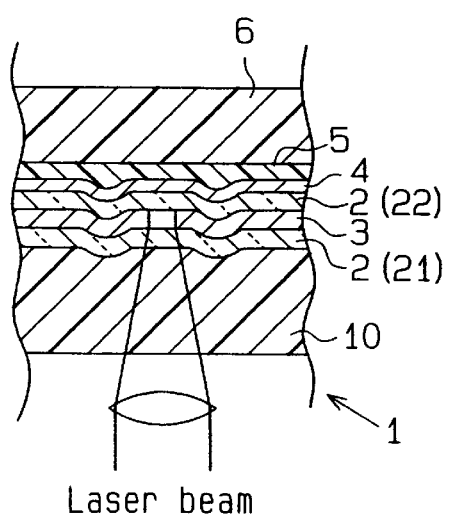
FIG. 4 is a partial cross-sectional view of an optical recording medium which comprises a phase change-type recording layer and protecting layers that contact the recording layer.

In the process of depositing the thin film protecting layer for the optical recording medium, the $ZnS$—$Nb_2O_5$ sintered material is used. The thin film is deposited by a vapor deposition process such as DC sputtering, using, the sintered material as the target in a predetermined shape formed from a mixed powder containing ZnS and $Nb_2O_5$. In the optical recording medium, as shown in FIG. 4, a thin film, i.e., the first protecting layer 21 is deposited on the disk substrate 10, which is made of a polymer, from the $ZnS$—$Nb_2O_5$ sintered material by vapor deposition process. On the first protecting layer 21 is separately formed the recording layer 3, and then, another thin film, i.e., the second protecting layer 22, is deposited on the recording layer 3 from the $ZnS$—$Nb_2O_5$ sintered material by a vapor deposition process. On the second protecting layer 22 is separately formed the reflecting layer 4, which is a deposited film composed of Al, Au or the like. Thus, the major structure of the optical recording medium is formed.

EXAMPLES

Example 1

This Example relates to raw materials for a sintered material.

As raw materials, a hexagonal crystal ZnS powder having a purity of 99.9% and an average particle diameter of 4 $\mu$m and a niobium oxide powder having a purity of 99.9% and an average particle diameter of 0.3 $\mu$m were used. Raw material powders having different contents of the niobium oxide in the mixture were obtained. The contents varied in the range from 0.5 to 30% by weight, were obtained.

Each of the raw material powders was dry-blended in a pot made of a resin using zirconia balls for 24 hours. After granulation, the temperature of the raw material powder was elevated to 900° C. at a rate of 3° C./min by hot pressing. Subsequently, each raw material powder was sintered for 3 hours while being pressurized under a plane pressure of 250 kg/cm² in an argon (Ar) atmosphere, to obtain a sample of a $ZnS$—$Nb_2O_5$-series sintered material in a disc such that its diameter was 50 mm and its thickness was 5 mm. Then, the sheet resistance of each of the resulting materials was measured by a four-probe method. The results are shown in Table 1.

TABLE 1

|   | $Nb_2O_5$ content (wt %) | sheet resistance ($\Omega$/□) |
|---|---|---|
| 1 | 0.5 | >>$10^9$ |
| 2 | 1.0 | >>$10^9$ |
| 3 | 5.0 | >>$10^9$ |
| 4 | 10 | 10.0 |
| 5 | 15 | 1.1 |
| 6 | 20 | 0.8 |
| 7 | 25 | 0.5 |
| 8 | 30 | 0.2 |

As shown in Table 1, when the $Nb_2O_5$ content was 5.0% or less, a large changes in the sheet resistance value was not observed. When the $Nb_2O_5$ content was more than 5.0 to 10%, the sheet resistance value was as low as 10 $\Omega$/□. When the $Nb_2O_5$ content was 20 to 30%, the sheet resistance value was as low as 1 $\Omega$/□ or less.

Example 2

This Example relates to sintered materials.

In this Example, a relative density (%), sheet resistance ($\Omega$/□), and sputtering rates (nm/min) in radio frequency (RF) sputtering and direct current (DC) sputtering of three different sintered materials were evaluated. The materials are as follows: a sintered material of $ZnS$—$Nb_2O_5$ (Sample 1) which was sintered by hot pressing, a sintered material of $ZnS$—$Nb_2O_5$ (Sample 2) which was sintered by atmospheric sintering, and a sintered material of $ZnS$—$SiO_2$ (Comparison 1) which was sintered by hot pressing.

Sample 1

Sample 1 is a sintered material obtained by hot pressing. As raw materials, a hexagonal crystal ZnS powder having purity of 99.9% and an average particle diameter of 4 μm and a niobium oxide powder having purity of 99.9% and an average particle diameter of 0.3 μm were used. A raw material powder was obtained by mixing together 80% by weight of the ZnS powder and 20% by weight of the niobium oxide powder.

The raw material powder was dry-blended in a pot made of a resin using zirconia balls for 24 hours. After granulation, the temperature of the raw material powder was elevated to 900° C. at a rate of 3° C./min by hot pressing. Subsequently, the raw material powder was sintered for 3 hours while being pressurized under a plane pressure of 250 kg/cm² in an Ar atmosphere, to obtain a ZnS—Nb$_2$O$_5$-series sintered material in a disc such that its diameter was 50 mm and its thickness was 5 mm. The relative density and the sheet resistance of the resulting material were measured. The relative density was measured by Archimedes' method. The results are shown in Table 2.

The obtained sintered material was ground to a predetermined size with a diamond tool. The sintered material was mounted on a copper backing plate using an indium (In) bonding, to prepare a sputtering target. Then, the sputtering target was used in RF sputtering and DC sputtering. The target was deposited on quartz substrates.

The conditions for the RF sputtering were selected such that the electric power was 800W and the Ar gas pressure was 1 Pa. The target was deposited on a quartz substrate so that the thickness of the resultant thin film was 100 nm. On the other hand, the conditions for the DC sputtering were selected such that the direct electric power was 2 kW and the Ar gas pressure was 1 Pa. The target was deposited on a quartz substrate so that the thickness of the resultant thin film was 100 nm. Table 3 shows the sputtering rates in the RF sputtering and the DC sputtering and the properties of the resultant films in both sputterings.

Sample 2

Sample 2 is a sintered material obtained by atmospheric sintering using a slurry. A raw material powder was obtained in the same manner as in the case of Sample 1 by mixing together 80% by weight of the hexagonal crystal ZnS powder and 20% by weight of the niobium oxide powder.

Distilled water and an organic binder were added to the raw material powder in a pot made of a resin. The raw material powder was wet-blended in the pot using zirconia balls for 24 hours, to thereby prepare a slurry. The slurry was then sprayed and dried for granulation, followed by compression using a mold, to obtain a shaped body. The temperature of the shaped body was elevated to 1100° C. at a rate of 3° C./min. Subsequently, the shaped body was sintered in an Ar atmosphere for 3 hours, to obtain a ZnS—Nb$_2$O$_5$-series sintered material in a disc such that its diameter was 50 mm and its thickness was 5 mm. Further, the sintered material was subjected to hot isostatic pressing (HIP) under a pressure of 2000 Pa at a temperature of 900° C., making it very dense. The relative density and the sheet resistance of the resulting material were measured. The relative density was measured by Archimedes' method. The results are shown in Table 2.

The sintered material was ground to a predetermined size by a diamond tool. A sputtering target was prepared in the same manner as in the case of Sample 1. The sputtering rates were evaluated in the same manner as in the case of Sample 1. The results are shown in Table 3.

Comparison 1

Comparison 1 is a sintered material which does not contain niobium oxide. As raw materials, a hexagonal crystal ZnS powder having purity of 99.9% and an average particle diameter of 4 μm and a silicon oxide powder having purity of 99.9% and an average particle diameter of 10 μm were used. A raw material powder was obtained by mixing together 80% by mole ZnS powder and 20% by mole silicon oxide powder.

The raw material powder was dry-blended in a pot made of a resin using zirconia balls for 24 hours. After granulation, the temperature of the raw material powder was elevated to 900° C. at a rate of 3° C./min by hot pressing. Subsequently, the raw material powder was sintered for 3 hours while being pressurized under a plane pressure of 250 kg/cm² in an Ar atmosphere, to thereby obtain a ZnS—SiO$_2$-series sintered material in a disc such that its diameter was 50 mm and its thickness was 5 mm. The relative density and the sheet resistance of the resulting material were measured. The relative density was measured by Archimedes' method. The results are shown in Table 2.

A sputtering target was prepared using the resulting sintered material in the same manner as in Sample 1. The sputtering rates were evaluated in the same manner as in Sample 1. The results are shown in Table 3.

TABLE 2

|  | Sample 1 | Sample 2 | Comparison 1 |
|---|---|---|---|
| relative density (%) | 91 | 90 | 88 |
| sheet resistance (Ω/□) | 0.8 | 0.9 | >10$^9$ |

TABLE 3

|  |  | Sample 1 | Sample 2 | Comparison 1 |
|---|---|---|---|---|
| sputtering rate (nm/min) | RF | 13.1 | 12.5 | 10.0 |
|  | DC | 26.6 | 25.9 | not available |

Table 2 shows that both Samples 1 and 2, which are the ZnS—Nb$_2$O$_5$-series sintered materials, have high density such that the relative density values are as high as 90% or more. Further, Comparison 1, which is the ZnS—SiO$_2$-series sintered material, also exhibits high density such that the relative density value is as high as 88%. The sheet resistance values of the sintered materials of Samples 1 and 2 are 0.8 Ω/□ and 0.9 Ω/□, respectively. This indicates that the sintered materials of Samples 1 and 2 have high conductivity. However, the sheet resistance of Comparison 1 is 10$^9$ Ω/□ or more. From this, it is found that the sintered material of Comparison 1 does not have high conductivity.

From Table 3, it is revealed that each of the sputtering rates of Samples 1 and 2 is significantly by 20 to 50% larger than that of Comparison 1, even when all of the thin films are deposited under the same conditions. Further, the ZnS—Nb$_2$O$_5$-series sintered materials of Samples 1 and 2 are deposited by DC sputtering. In each of Samples 1 and 2, the DC sputtering rate is two times as large as that in the RF sputtering. The ZnS—SiO$_2$-series sintered material of Comparison 1 is not deposited by DC sputtering.

The sintered material of the present invention has a high conductivity and a low resistance, as compared to the conventional sintered material formed by 80% by mole ZnS and 20% by mole SiO$_2$. Therefore, it is possible to deposit thin films not only by RF sputtering but also by DC sputtering. The use of DC sputtering increases the deposition rate of a thin film. In the phase change-type optical recording medium using a recording layer composed of an alloy of tellurium (Te) or antimony (Sb), the production rate of a protecting layer of thin film can be increased by DC sputtering.

Example 3

This Example relates to a target for sputtering.

Using the sintered materials in Example 1, sputtering rates in a DC sputtering process and an RF sputtering process were measured. In the RF sputtering process, electric power of 800 W and an Ar gas pressure of 1 Pa were selected. Using each of the sintered materials as the target, a thin film having a thickness of 100 nm was deposited on a quartz substrate. On the other hand, in the DC sputtering process, direct electric power of 2 kW and an Ar gas pressure of 1 Pa were selected. Using each of the sintered materials as the target, a thin film having a thickness of 100 nm was deposited on a quartz substrate. The test results are summarized in Table 4.

TABLE 4

| $Nb_2O_5$ content (%) | sputtering rate (nm/min) | |
|---|---|---|
| | DC sputtering | RF sputtering |
| 10 | 22.0 | 12.0 |
| 15 | 24.1 | 12.5 |
| 20 | 26.6 | 13.1 |
| 25 | 29.0 | 14.8 |
| 30 | 31.0 | 16.3 |
| 20 mol % $SiO_2$ | not available | 10.0 |

From Table 2, it is found that the DC sputtering rate is about two times as large as that the RF sputtering rate. From the viewpoint of improving productivity, the conventional ZnS—$SiO_2$-series thin film can be deposited only by RF sputtering, whereas the ZnS—$Nb_2O_5$-series thin film can be deposited by DC sputtering. Therefore, it is found that the sputtering rate of the ZnS—$SiO_2$-series thin film is relatively low, while the sputtering rate of the ZnS—$Nb_2O_5$-series thin film is increased.

Further, in the conventional ZnS—$SiO_2$-series thin film, there occurred a change in the optical characteristics of the thin film between the portion of the thin film deposited immediately after the start of the use of the target in the sputtering process and the portion of the thin film deposited when the target is largely consumed. However, in the ZnS—$Nb_2O_5$-series thin film, no change in the optical characteristics of the thin film occurred.

Example 4

This Example relates to a thin film.

With respect to the ZnS—$Nb_2O_5$-series thin film, the relationship between the refractive index and the composition was examined. By using the sputtering process in Example 3, ZnS-series thin films having different $Nb_2O_5$ contents were deposited on quartz glass substrates, and the complex index of refraction of each thin film was measured.

FIG. 1 shows the results of the measurements for the complex indices of refraction of the thin films relative for light having a wavelength of 400 nm. When the niobium oxide content of the films is up to 10%, in terms of $Nb_2O_5$, the refractive index largely increases when the niobium oxide content increases. However, when the niobium oxide content of the film is more than 10%, in terms of $Nb_2O_5$, the proportion of the increase in the refractive index to the niobium oxide content falls. This figure shows that the thin film in which niobium oxide content is more than 10 is as high as 2.5 to 2.7 for light having a wavelength of 400 nm.

Figure 2A:
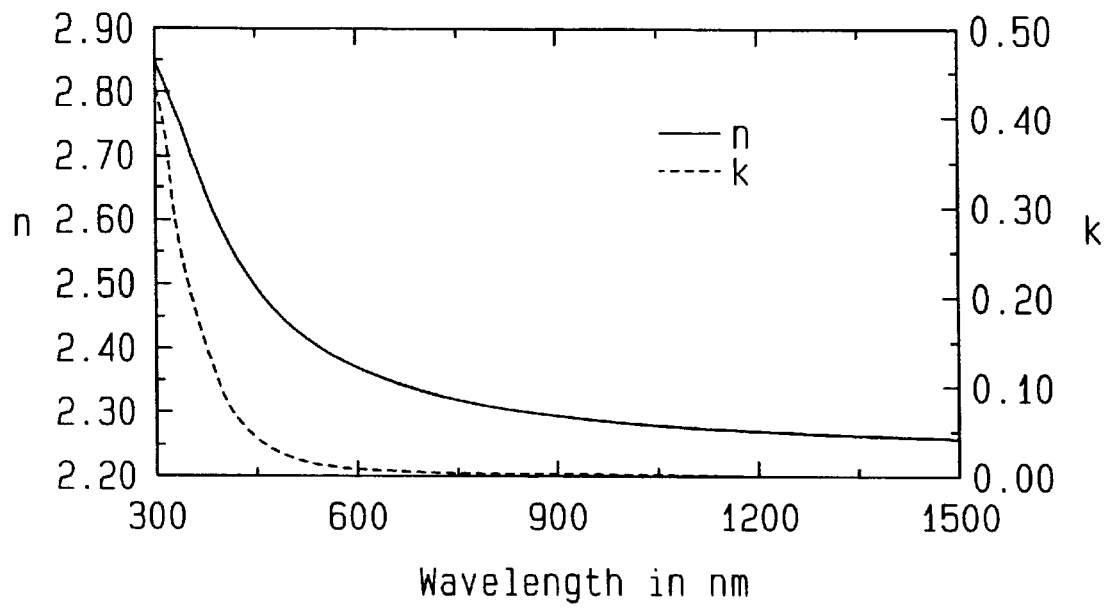
FIGS. 2(A) and 2(B) are graphs showing the relationship between the refractive index and the wavelength of light for the ZnS-niobium oxide thin film according to one embodiment of the present invention.
Figure 2B:
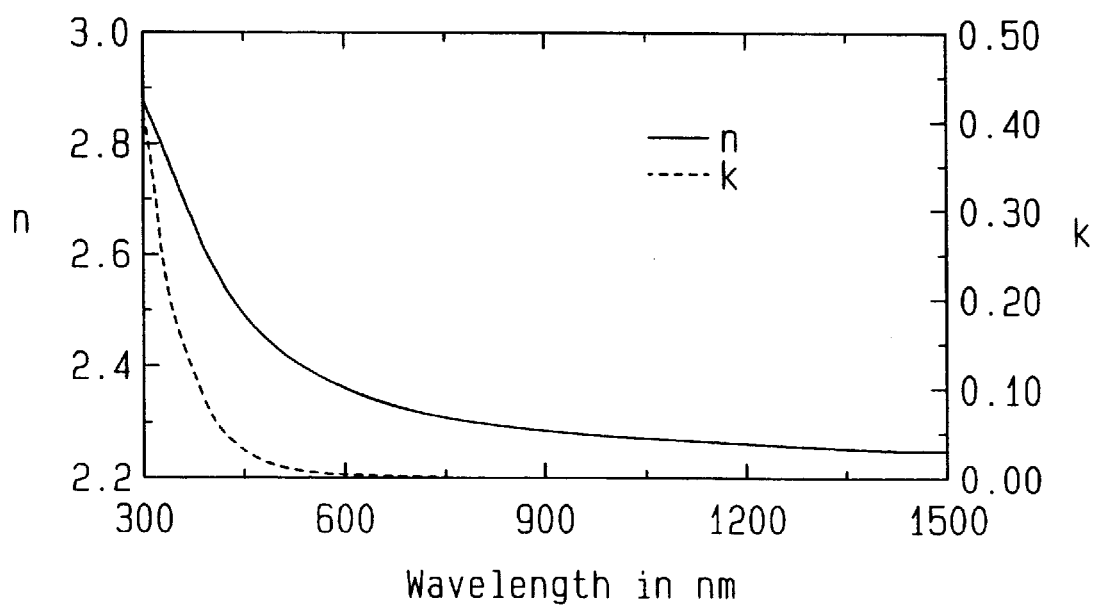

FIGS. 2(A) and 2(B) show the relationship between the complex index of refraction n and the wavelength of light for the ZnS-series thin film. FIG. 2(A) is a graph for the thin film that contains 20% $Nb_2O_5$, and FIG. 2(B) is a graph for the thin film that contains 15% $Nb_2O_5$.

To confirm the dependencies of the optical characteristics of the ZnS—$Nb_2O_5$-series thin film on the reproducibility and the production method, thin films were deposited by deposition processes other than the above-mentioned RF sputtering process and DC sputtering process such as a vacuum deposition process, a plasma chemical vapor deposition (CVD) process, an optical CVD process, an ion plating process, and an electron-beam evaporation process. The refractive indices were measured. The thin films obtained by any of the above processes have a refractive index for a wavelength of 400 nm as high as 2.57 to 2.59. From this, it is found that substantially equivalent thin films can be prepared, irrespective of the deposition process.

Further, the thin film of the present invention has a refractive index as high as 2.29 or more for light having a wavelength of 800 nm or less. Using this thin film, a protecting layer for an optical recording medium having a phase change-type recording layer composed of an alloy containing Te or Sb can be formed. In addition, a thin protective layer can be formed by using the high refractive index of the thin film. Therefore, an optical recording medium having a small stress can be prepared while ensuring the thermal stability of the protecting layer, thus improving the reliability of the optical recording medium.

Figure 3A:
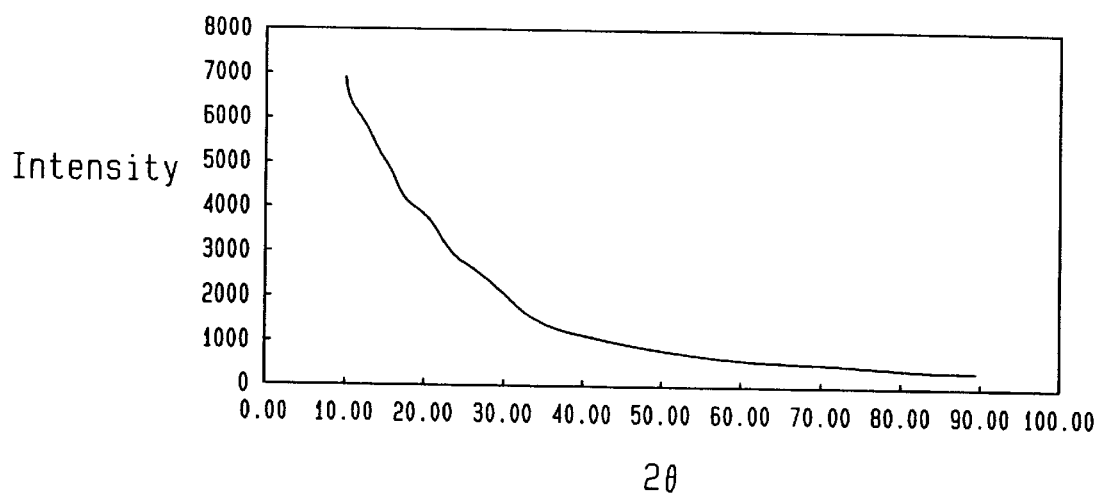
FIGS. 3(A) and 3(B) are charts obtained by measuring X-ray diffractometry (XRD), which examines the crystal orientation of the ZnS-niobium oxide thin film, according to one embodiment of the present invention.
Figure 3B:
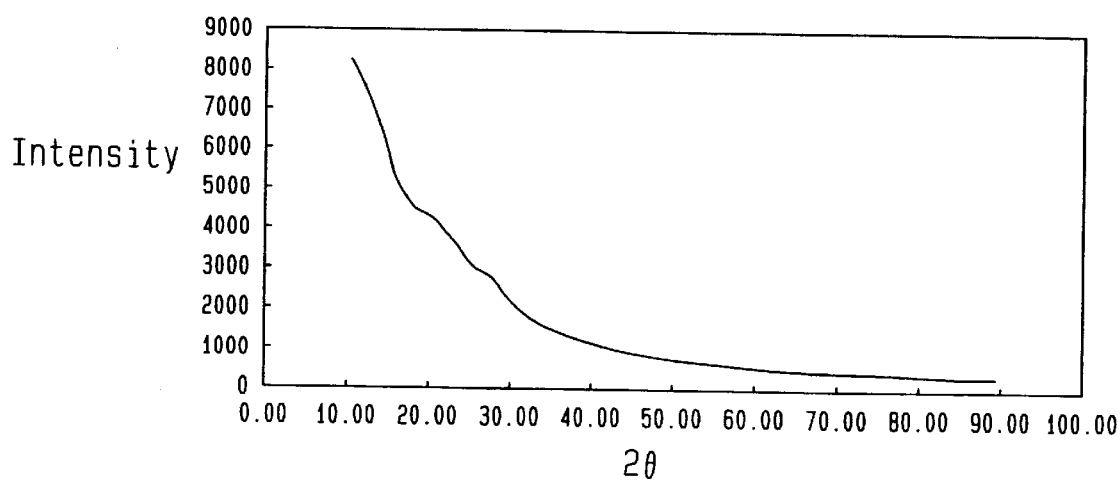

The structure of the ZnS—$Nb_2O_5$-series thin film was examined. ZnS—$Nb_2O_5$-series thin films containing 10% and 30% niobium oxide (in terms of $Nb_2O_5$) were individually deposited on glass substrates at ambient temperature by a sputtering process in the same manner as in Example 3 so that the thickness of each of the resultant films was 100 nm. The resultant thin films were heated at 700° C., and then, the crystal orientation of the thin films were examined by X-ray diffractometry (XRD). As shown in FIGS. 3(A) and 3(B), the thin films are amorphous such that no crystal diffraction peak can be confirmed. $Nb_2O_5$ is not crystallized even when $Nb_2O_5$ is heated at 700° C. $Nb_2O_5$ is also hardly crystallized by a laser beam irradiation. Accordingly, it is expected that the peeling of the thin film and the deformation of the substrate can be prevented when stress is generated in the thin film.

It should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope and equivalence of the appended claims.

What is claimed is:

1. A method for producing a ZnS-series thin film comprising:
    preparing a ZnS-series sintered material comprising ZnS as a main component and niobium oxide; and
    subjecting the ZnS-sintered material to direct current sputtering to form a ZnS-series thin film.

* * * * *